United States Patent
Ben-Chen et al.

(10) Patent No.: US 11,522,738 B1
(45) Date of Patent: Dec. 6, 2022

(54) HIGH-SPEED COMMUNICATION LINK WITH SELF-ALIGNED SCRAMBLING

(71) Applicant: QUALCOMM Incorporated, San Diego, CA (US)

(72) Inventors: Tomer Rafael Ben-Chen, Amikam (IL); Sharon Graif, Zichron Yaakov (IL); Lior Amarilio, Yokneam (IL)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/354,332

(22) Filed: Jun. 22, 2021

(51) Int. Cl.
| | |
|---|---|
| *H04L 25/49* | (2006.01) |
| *H04W 72/04* | (2009.01) |
| *H04L 25/03* | (2006.01) |
| *H03K 19/21* | (2006.01) |
| *H04B 1/40* | (2015.01) |

(52) U.S. Cl.
CPC .......... *H04L 25/49* (2013.01); *H03K 19/215* (2013.01); *H04B 1/40* (2013.01); *H04L 25/03866* (2013.01); *H04W 72/0466* (2013.01)

(58) Field of Classification Search
CPC . H04L 25/49; H04L 25/03866; H03K 19/215; H04W 72/0466
See application file for complete search history.

(56) References Cited

U.S. PATENT DOCUMENTS

| | | | |
|---|---|---|---|
| 7,392,412 B1 * | 6/2008 | Lo ............................ | H04L 12/12 713/323 |
| 9,602,433 B2 | 3/2017 | Huang et al. | |
| 2003/0161348 A1 * | 8/2003 | Mills ........................ | H04L 12/12 370/422 |
| 2003/0165142 A1 * | 9/2003 | Mills ........................ | H04L 12/12 370/395.62 |
| 2003/0206564 A1 * | 11/2003 | Mills ........................ | H04L 12/12 370/469 |
| 2017/0223646 A1 * | 8/2017 | Romera ..................... | H04L 7/02 |
| 2018/0004685 A1 * | 1/2018 | Bhatt .................. | G06F 13/4068 |
| 2022/0121789 A1 * | 4/2022 | Kanza ...................... | G06T 17/00 |

OTHER PUBLICATIONS

Apple Inc. et al., "Universal Serial Bus 3.2 Specification," Sep. 22, 2017, USB 3.0 Promoter Group, 548 pages.

(Continued)

*Primary Examiner* — Jaison Joseph
(74) *Attorney, Agent, or Firm* — W&T/Qualcomm

(57) ABSTRACT

High-speed communication links with self-aligned scrambling on a communication link that sends scrambled signals may include a slave device that may self-align by initially detecting an unscrambled preamble symbol and more particularly detect an edge of the unscrambled preamble symbol. Based on the detected edge, a fine alignment adjustment may be made by testing subsequent scrambled data for a repeated pattern such as an IDLE symbol by comparing the repeated pattern to a candidate scrambled sequence that has been received through the communication link. The comparison may use an exclusive OR (XOR) circuit on some bits to derive a scrambler seed that is used to test for a match for the remaining bits. If there is a match, the scrambler seed and frame alignment have been detected and alignment is achieved.

28 Claims, 8 Drawing Sheets

(56) References Cited

OTHER PUBLICATIONS

Intel: "LXT1000 Gigabit Ethernet Transceiver", Order No. 249276-002, Intel Data Sheet, XX, XX, Jul. 1, 2001, pp. 1-105, XP002259432, p. 58, paragraph section 2.6.2 2.
International Search Report and Written Opinion for International Patent Application No. PCT/US2022/072506, dated Aug. 16, 2022, 20 pages.

* cited by examiner

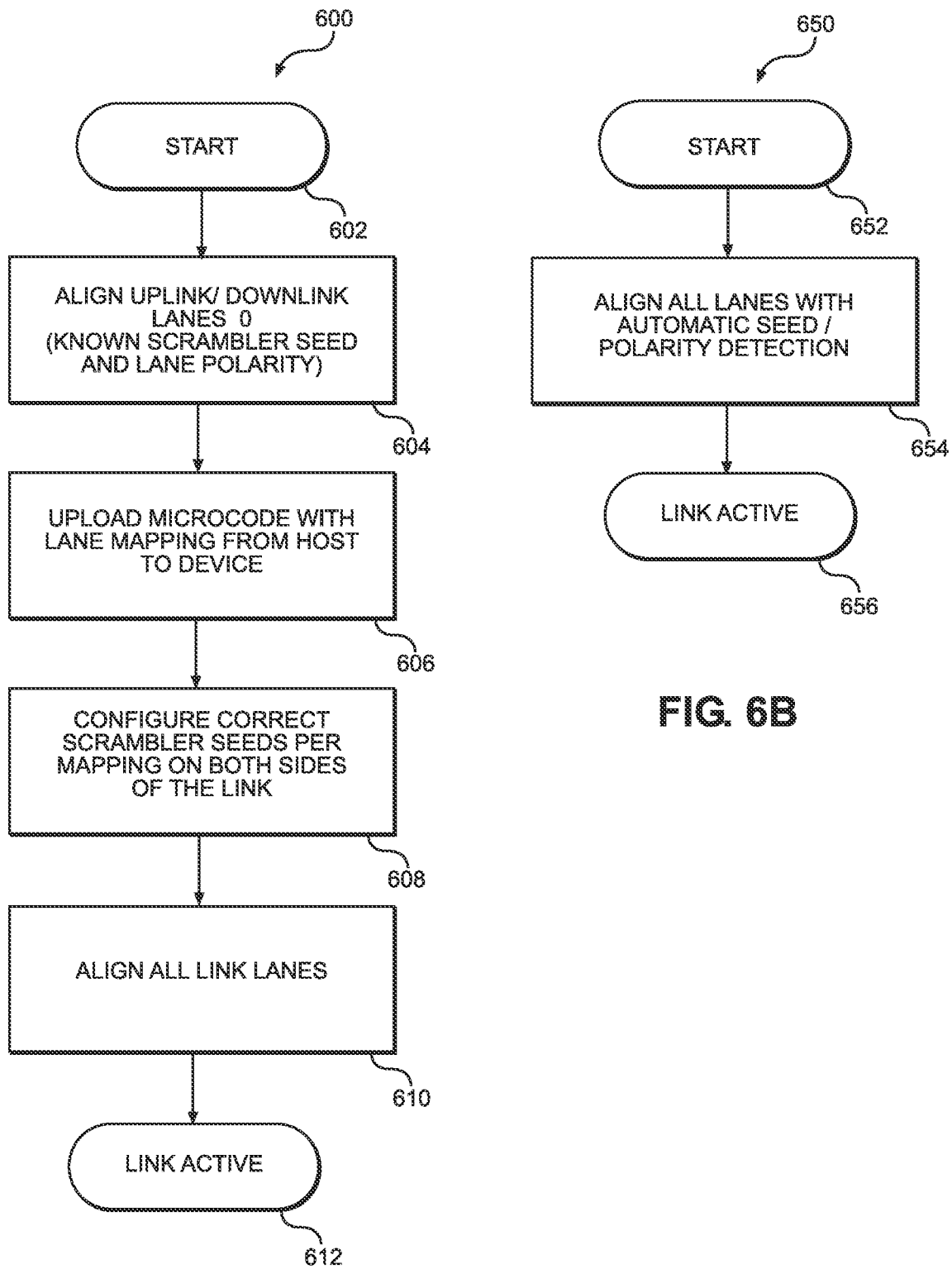

HIGH-SPEED COMMUNICATION LINK WITH SELF-ALIGNED SCRAMBLING

BACKGROUND

I. Field of the Disclosure

The technology of the disclosure relates generally to high-speed communication links or buses within a computing device and particularly, to high-speed communication links in a mobile computing device.

II. Background

Computing devices abound in modern society, and more particularly, mobile communication devices have become increasingly common. The prevalence of these mobile communication devices is driven in part by the many functions that are now enabled on such devices. Increased processing capabilities in such devices means that mobile communication devices have evolved from pure communication tools into sophisticated mobile entertainment centers, thus enabling enhanced user experiences. With the advent of the myriad functions available to such devices, there has been increased pressure to find ways to reduce power consumption. One way that power consumption has been reduced is to put circuits and communication links to sleep or change the duty cycle of the communication links. Reducing the duty cycle of the communication links creates its own challenges.

SUMMARY OF THE DISCLOSURE

Aspects disclosed in the detailed description include high-speed communication links with self-aligned scrambling. In a communication link that sends scrambled signals (e.g., to reduce cross-talk or electromagnetic interference (EMI)), a slave or remote device may self-align by initially detecting an unscrambled preamble symbol and, more particularly, detect an edge of the unscrambled preamble symbol. Based on the detected edge, a fine alignment adjustment may be made by testing subsequent scrambled data for a repeated pattern, such as an IDLE symbol, by comparing the repeated pattern to a candidate scrambled sequence that has been received through the communication link. The comparison may use an exclusive OR (XOR) circuit to perform an XOR operation on some bits to derive a scrambler seed that is used to test for a match for the remaining bits. If there is a match, the scrambler seed and frame alignment have been detected, and alignment is achieved. This approach to alignment is well suited to helping short duty-cycle symbols remain aligned, which helps power saving and maintains low latency.

In this regard in one aspect, a device is disclosed. The device includes a physical layer (PHY) configured to be coupled to a communication link and receive signals therefrom. The device also includes an alignment circuit coupled to the PHY. The device also includes a control circuit. The control circuit is configured to cause the alignment circuit to detect a possible edge of an unscrambled preamble symbol in an alignment portion of a received signal. The control circuit is also configured to, based on a position of the possible edge, check a scrambled known symbol for a scrambler seed and alignment. The control circuit is also configured to align based on checking the scrambled known symbol.

In another aspect, a host is disclosed. The host includes a PHY configured to be coupled to a communication link and send signals thereon. The host also includes a scrambler circuit. The host also includes a control circuit. The control circuit is configured to assemble a signal using a plurality of unscrambled preamble symbols followed by a second plurality of scrambled known symbols using the scrambler circuit. The control circuit is also configured to send the signal to a device over the communication link through the PHY.

In another aspect, a computing device is disclosed. The computing device includes a serial communication link. The computing device also includes a host. The host includes a host PHY coupled to the serial communication link and configured to send signals thereon. The host also includes a scrambler circuit. The host also includes a control circuit. The control circuit is configured to assemble a signal using a plurality of unscrambled preamble symbols followed by a second plurality of scrambled known symbols using the scrambler circuit. The control circuit is also configured to send the signal to a device over the serial communication link through the host PHY. The computing device also includes a device. The device includes a device PHY coupled to the serial communication link and configured to receive the signal therefrom. The device also includes an alignment circuit coupled to the device PHY. The device also includes a control circuit. The control circuit is configured to cause the alignment circuit to detect a possible edge of an unscrambled preamble symbol of the plurality of unscrambled preamble symbols. The control circuit is also configured to, based on a position of the possible edge, check a scrambled known symbol of the second plurality of scrambled known symbols for a scrambler seed and alignment. The control circuit is also configured to align based on checking the scrambled known symbol.

In another aspect, a method for aligning a device coupled to a communication link is disclosed. The method includes receiving a plurality of unscrambled preamble symbols. The method also includes detecting an edge of one of the plurality of unscrambled preamble symbols. The method also includes, based on the edge, testing a scrambled known symbol against an unscrambled version of the scrambled known symbol to derive a scrambler seed. The method also includes testing a portion of the scrambled known symbol using the scrambler seed.

BRIEF DESCRIPTION OF THE FIGURES

FIG. 6A is a flowchart illustrating a conventional process for lane mapping on a communication link;

FIG. 6B is a flowchart illustrating an exemplary process for lane mapping available after implementation of exemplary aspects of the present disclosure;

DETAILED DESCRIPTION

Figure 1:
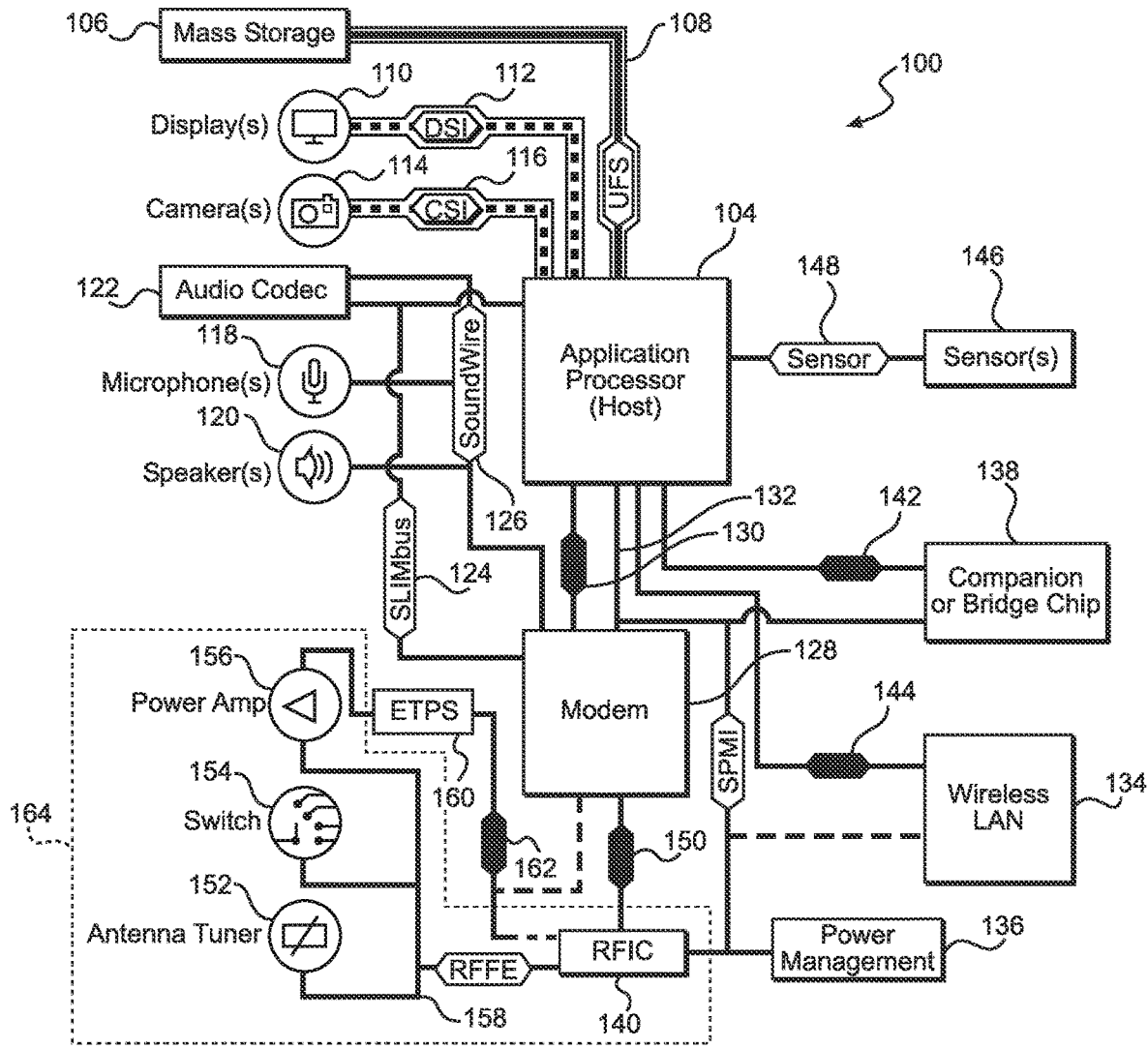
FIG. 1 is a block diagram of an exemplary mobile communication device with various internal communication links or buses that may benefit from the improved self-aligning scrambling techniques of the present disclosure.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include high-speed communication links with self-aligned scrambling. In a communication link that sends scrambled signals (e.g., to reduce cross-talk or electromagnetic interference (EMI)), a slave or remote device may self-align by initially detecting an unscrambled preamble symbol and, more particularly detect an edge of the unscrambled preamble symbol. Based on the detected edge, a fine alignment adjustment may be made by testing subsequent scrambled data for a repeated pattern such as an IDLE symbol by comparing the repeated pattern to a candidate scrambled sequence that has been received through the communication link. The comparison may use an exclusive OR (XOR) circuit to perform an XOR operation on some bits to derive a scrambler seed that is used to test for a match for the remaining bits. If there is a match, the scrambler seed and frame alignment have been detected, and alignment is achieved. This approach to alignment is well suited to helping short duty cycle symbols remain aligned, which helps power saving and maintains low latency.

Figure 2:
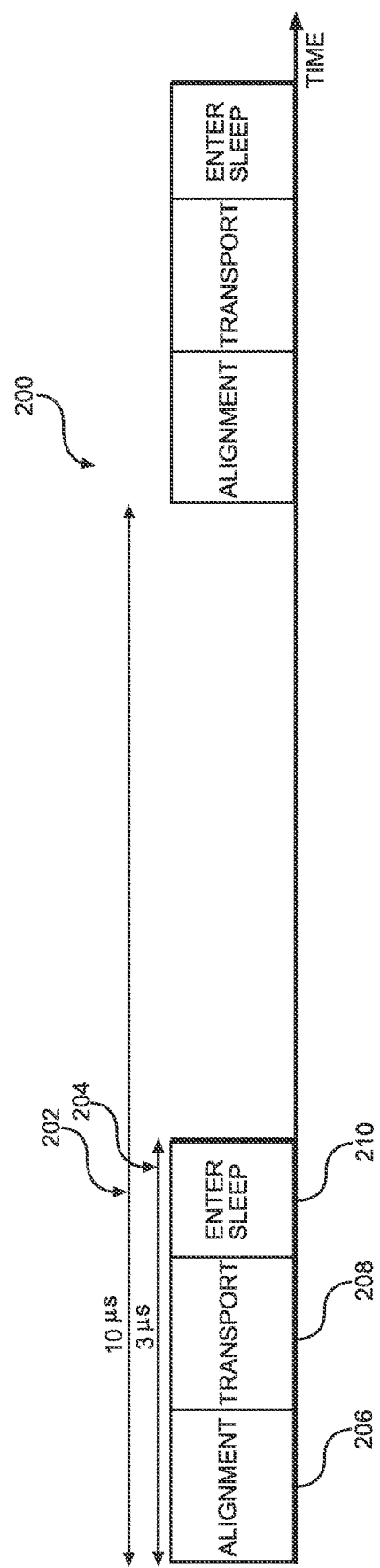
FIG. 2 is a signal diagram illustrating an exemplary short duty-cycle signal that may be sent over one of the communication links in the mobile communication device of FIG. 1.
Figure 3:
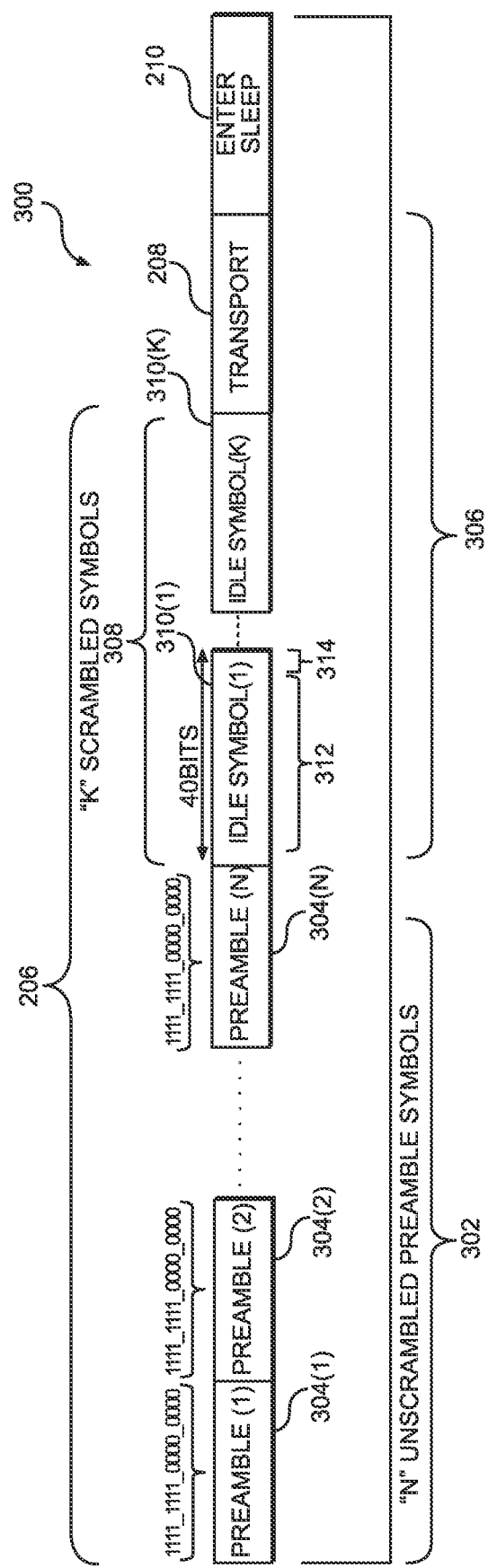
FIG. 3 is a signal diagram illustrating an active portion of the short duty-cycle signal of FIG. 2.

Before addressing specific aspects of the present disclosure, a brief overview of the environment in which communication links exist that may benefit from the self-aligning techniques of the present disclosure is provided in FIG. 1. Additionally, FIGS. 2 and 3 provide additional discussion of the signals that cross the communication links of the communication device of FIG. 1. A discussion of exemplary processes according to the present disclosure begins below with reference to FIG. 4.

In this regard, FIG. 1 is a system-level block diagram of an exemplary computing device, which in an exemplary aspect may be a mobile communication device or mobile terminal 100 such as a smart phone, mobile computing device tablet, or the like. It should be appreciated that while the present disclosure focuses on a mobile device such as mobile terminal 100, the present disclosure is not so limited, and any computing device (mobile, desktop, or the like) may benefit from the present disclosure. The mobile terminal 100 includes an application processor 104 (sometimes referred to as a host) that communicates with a mass storage element 106 through a universal flash storage (UFS) bus 108. The application processor 104 may further be connected to a display 110 through a display serial interface (DSI) bus 112 and a camera 114 through a camera serial interface (CSI) bus 116. Various audio elements such as a microphone 118, a speaker 120, and an audio codec 122 may be coupled to the application processor 104 through a serial low-power inter-chip multimedia bus (SLIMbus) 124. Additionally, the audio elements may communicate with each other through a SOUNDWIRE bus 126. A modem 128 may also be coupled to the SLIMbus 124 and/or the SOUNDWIRE bus 126. The modem 128 may further be connected to the application processor 104 through a peripheral component interconnect (PCI) or PCI express (PCIe) bus 130 and/or a system power management interface (SPMI) bus 132.

With continued reference to FIG. 1, the SPMI bus 132 may also be coupled to a local area network (LAN or WLAN) IC (LAN IC or WLAN IC) 134, a power management integrated circuit (PMIC) 136, a companion IC (sometimes referred to as a bridge chip) 138, and a radio frequency IC (RFIC) 140. It should be appreciated that separate PCI buses 142 and 144 may also couple the application processor 104 to the companion IC 138 and the WLAN IC 134. The application processor 104 may further be connected to sensors 146 through a sensor bus 148. The modem 128 and the RFIC 140 may communicate using a bus 150. In an exemplary aspect the bus 150 may be a QLINK bus, such as that disclosed in QUALCOMM's U.S. Pat. No. 9,602,433.

With continued reference to FIG. 1, the RFIC 140 may couple to one or more RFFE elements, such as an antenna tuner 152, a switch 154, and a power amplifier 156 through a radio frequency front end (RFFE) bus 158. Additionally, the RFIC 140 may couple to an envelope tracking power supply (ETPS) 160 through a bus 162, and the ETPS 160 may communicate with the power amplifier 156. Collectively, the RFFE elements, including the RFIC 140, may be considered an RFFE system 164. It should be appreciated that the RFFE bus 158 may be formed from a clock line and a data line (not illustrated). Note that in some implementations, the bus 150 may couple the modem 128 to a single transceiver chip that incudes multiple RFFE elements.

It should be appreciated that several high-speed communication links or buses may be present in the mobile terminal 100 (or other computing device, mobile or stationary). For example, the PCIE buses, the universal serial bus (USB) buses, and the QLINK bus may all be considered high-speed communication links. As a note of nomenclature, a high-speed communication link is a link that is faster than four hundred megabits per second and may be faster than one gigabit per second. High-speed communication links are useful for the rapid transmission of data but create additional challenges from crosstalk and electromagnetic interference (EMI). One way that crosstalk and EMI are reduced is through the use of a scrambler circuit that scrambles data sent over a lane within the communication link. While encryption is sometimes referred to as scrambling, that use of scrambling is not contemplated herein. The present disclosure is not concerned with interception of the data or rendering the data unintelligible per se but is more concerned with giving the transmitted data useful engineering properties that may be achieved with scrambling.

One such type of scrambler is an additive scrambler. An additive scrambler (sometimes referred to as a synchronous scrambler) transforms the input data stream by applying a pseudo-random binary sequence (PRBS) though modulo-two addition. The PRBS is typically generated by a linear-feedback shift register (LFSR). In operation, a scrambler and descrambler both start at a predefined initial state and a shared scrambling algorithm. As each bit is sent, the scrambler increments through the PRBS and uses the algorithm to determine a bit to be sent. The descrambler receives the scrambled bit and reverses the algorithm using the known place in the PRBS. Normally, to assure synchronous operation of the transmitting and receiving elements, a sync-word may be used. A sync-word is a pattern that is placed in the data stream through equal intervals (e.g., each frame). The receiver searches for a few sync-words in adjacent frames and determines when the LFSR must be reloaded with a predefined initial state. In theory, this process should work well for any communication link.

However, pressures to conserve power in mobile computing devices such as mobile terminal 100 have caused the implementation of short duty-cycles. For example, it is now not uncommon that more than fifty percent (50%) of the period of a signal may be at a low state to conserve energy. An example short duty-cycle signal 200 is shown in FIG. 2. The signal 200 has a period 202 of, for example, ten microseconds (10 us), but an active portion 204 of three microseconds (3 us), or a thirty percent duty-cycle. Within that active portion 204, an alignment portion 206, a transport portion 208, and an enter sleep portion 210 may be provided.

Not sending a sync-word risks losing scrambler synchronization. However, if a sync-word has to be added to the active portion 204, then, to keep the same duty-cycle, the transport portion 208 must be shortened. Alternatively, the duty-cycle may be increased, resulting in less power savings. While hardware solutions may be implemented, such approaches increase cost, consume space, add extra power consumption, and may be error prone with limited recovery solutions.

Exemplary aspects of the present disclosure provide self-aligned scrambling on high-speed communication links in a manner that does not require sync-words and provides opportunities for recovery in the event of lost synchronization. In particular, exemplary aspects of the present disclosure send an initial unscrambled preamble. In an exemplary aspect, this preamble is sixteen (16) bits. The receiver can detect the edges of this unscrambled preamble, although depending on the design of the bits in the preamble, this edge detection may only allow for a granularity of eight (8) bits to account for inversion (more details are provided on this below). In effect, detection of the preamble edge provides a coarse alignment. A known pattern is then scrambled and sent. In an exemplary aspect, the known pattern is an IDLE symbol. In an exemplary aspect, the length of the known pattern is longer than the width of the scrambler. The received scrambled signal is then evaluated by the receiver. Specifically, the receiver then examines every possible location from the coarse alignment (e.g., every eight bits) by performing an XOR operation on the known pattern (or the inverted version of the known pattern) with the received signal to get a candidate scrambler sequence of a length equal to the scrambler width. The result of this XOR operation is used to back convert to determine a scrambler seed. The remaining bits of the known pattern (the length minus the scrambler width) are then checked to see if they match the remainder of the received signal. If the bits match, then the scrambler seed and frame alignment are correct at the checked position and the receiver is aligned. Recovery operates similarly but avoids use of soft decisions.

To better understand exemplary aspects of the present disclosure, FIG. 3 illustrates an exemplary signal 300 used by a master or host within the mobile terminal 100 to provide self-aligned scrambled signaling on, for example the bus 150. The signal 300 begins with a preamble portion 302 that includes "N" preamble symbols 304(1)-304(N), generically 304. The preamble symbols 304 are not scrambled and may be, for example, 16 bits each. In an exemplary aspect, the preamble symbol may be 1111_1111_0000_0000, and the preamble portion 302 is eighty (80) bits long (meaning N=5). The preamble portion 302 of the signal 300 is followed by a scrambled portion 306. That is, bits in the scrambled portion 306 are scrambled by a scrambler circuit within the master or host before transmission over a link or bus such as the bus 150. The scrambled portion 306 has an initial portion 308 which includes "K" repeated known symbols 310(1)-310(K), generically 310. In an exemplary aspect, the known symbol is a forty (40) bit IDLE symbol and K is four (4), meaning that the initial portion 308 is one hundred sixty (160) bits long. In an exemplary protocol, an IDLE symbol may be defined as 0x6680000068. Note that some exemplary protocols also define a similar end of packet burst (EPB), which may be 0x668000FF68 (a difference of only eight bits). The EPB is sent prior to entering a sleep mode and may be used by the master or host in place of an IDLE symbol and accordingly, the EPB may be a second known symbol. It should be appreciated that other protocols may have comparable known symbols, and the particular composition of the known symbol (whether the symbol be an IDLE symbol or some other symbol) is not central to the present disclosure. The scrambled portion 306 also includes the transport portion 208. The signal 300 has a final portion corresponding to the enter sleep portion 210, which may be scrambled. It should be appreciated that the alignment portion 206 corresponds to the combination of the preamble portion 302 and the initial portion 308. Conceptually, each repeated known symbol 310 has a "seed" portion 312 and a test portion 314. Using an IDLE symbol of 40 bits, the seed portion 312 may be twenty-three (23) bits corresponding to a scrambler width ("w") equal to twenty-three and a test portion 314 of seventeen (17) bits.

While specific IDLE and EPB symbols are contemplated, it should be appreciated that different protocols may use other known symbols that have comparable properties and may be used without departing from the present disclosure.

It should be appreciated that many links and buses may use inversion encoding due to routing constraints on a printed circuit board (PCB) that are imposed to avoid crossing differential traces on the PCB or the like. The preamble symbol 304 may be chosen with this possibility in mind. Thus, when 1111_1111_0000_0000 is inverted, the preamble symbol 304 becomes 0000_0000_1111_1111, which when followed by another inverted preamble symbol is 0000_0000_1111_1111_0000_0000_1111_1111. Having the known preamble symbol appear inside two adjacent inverted preamble symbols 304 will be of use as better explained below.

Figure 4:
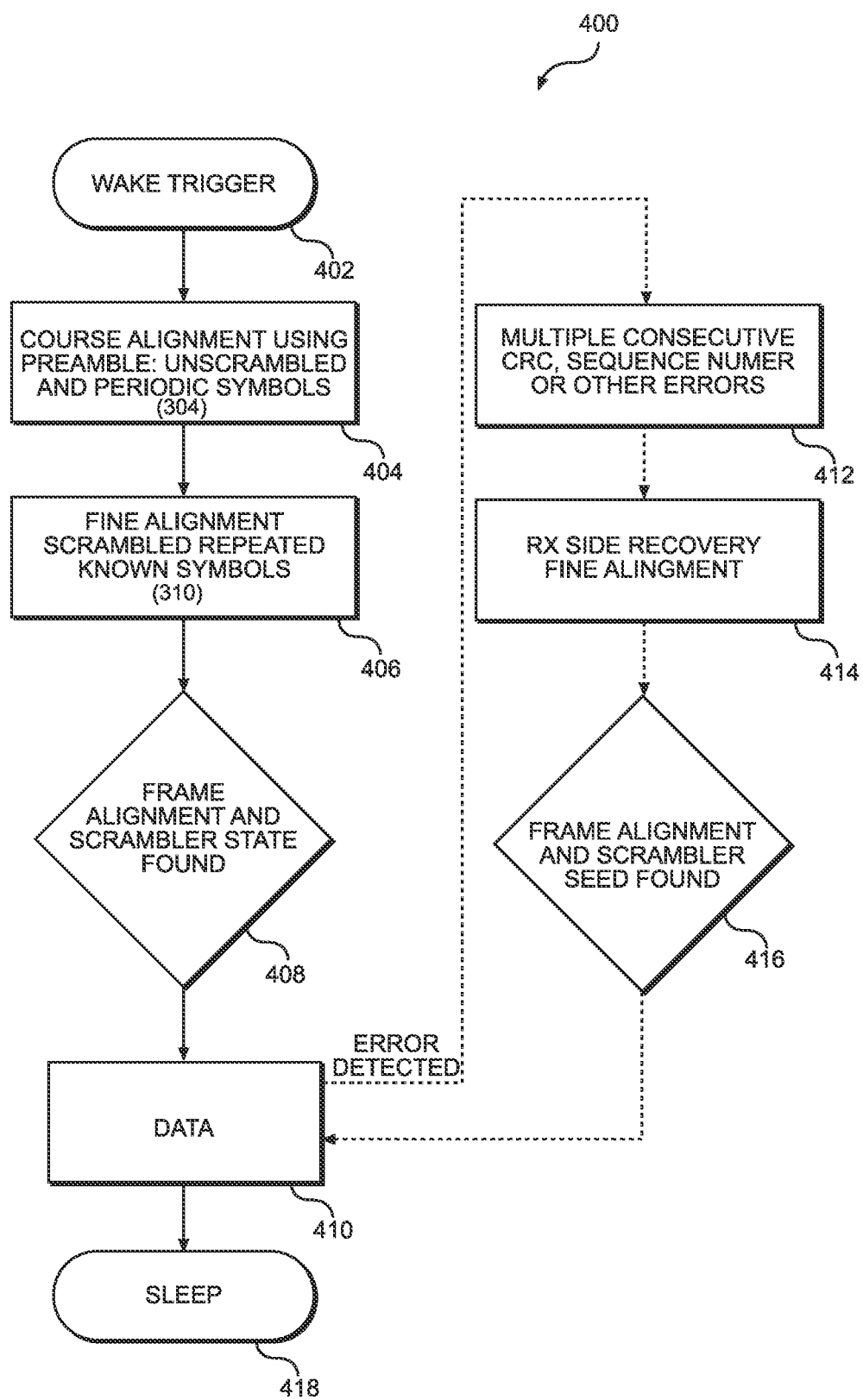
FIG. 4 is a flowchart illustrating an exemplary process for performing coarse and fine adjustments to align a scrambled signal on a communication link according to exemplary aspects of the present disclosure.

Given this alignment portion 206 with unscrambled preamble portion 302 and scrambled repeated known symbols in the initial portion 308 allows for self-alignment as illustrated by a process 400 shown by the flowchart of FIG. 4. Before process 400 starts, the termini of the communication link may have exchanged a scrambler seed for each lane of the communication link. Likewise, certain symbols will have been predefined or exchanged including the preamble symbol and the known symbol (e.g., the IDLE symbol). At some point the communication link will have entered a low-power or sleep state. The process 400 may now begin with a wake trigger (block 402). The process continues with a control circuit of the receiver performing coarse alignment using the unscrambled and periodic preamble symbols 304 (block 404).

In particular, the receiver detects the known pattern of the preamble symbol. Using the example of 1111_1111_0000_000, the receiver detects the actual preamble symbol. If inversion is used, the receiver may detect the middle sixteen bits of two adjacent but inverted preamble symbols and thus could construe the edge of the preamble symbol incorrectly (i.e., the detected edge in the middle of two adjacent inverted symbols is off by eight bits). Because of this minor uncertainty, the granularity of the coarse alignment is within, using this example, eight bits. Accordingly, the receiver then performs a fine alignment using patterns of the scrambled repeated known symbols 310 (block 406). In this example, the receiver may check for non-inverted matches at 0, 16, 32, 48, etc. and check for inverted matches at 8, 24, 40, 56, etc. Such approach to the fine alignment may save hardware and reduces the chances of a matching alignment at an incorrect offset.

In an exemplary communication link, an IDLE symbol is a known filler pattern that is sent when there is no data available to be sent. The IDLE symbol is forty (40) bits and is generally the smallest item sent over the communication link. By design all elements on the link may be aligned ("frame alignment") to the length of the IDLE symbol. Further, the IDLE symbol has good autocorrelation properties. Accordingly, the IDLE symbol is well suited for use as a scrambled repeated known symbol 310. Likewise, the scrambler length in an exemplary link may be twenty-three (23) bits, which is less than the forty-bit length ("1") of the IDLE symbol.

Accordingly, fine alignment may be done by checking, at increments corresponding to the suspected frame edge (based on the granularity of the detected preamble symbol (e.g., every eight bits using the example above)), for a match with an expected scrambled sequence. This check may be done by XORing the forty bits received at the suspected frame edge with the known IDLE symbol. Taking the result of this XOR operation, the control circuit of the receiver uses the first twenty-three bits (corresponding to "w") to determine the scrambler seed and uses that determined scrambler seed to check the remaining seventeen (l–w) bits to see if they match the scrambler sequence associated with the determined scrambler seed. Thus, the frame alignment and scrambler state are found (block 408). In an exemplary aspect, a soft match is sufficient to account for possible link errors. To further assist in finding a match, an inverse calculation may be done at complementary alignments (e.g., instead of 0, 16, 32, 48, etc. the inverse calculation may be done at 8, 24, 40, 56, etc.) to detect a lane inversion. Thus, since there are K instances of known symbol 310, there are "K" chances to find a match, although more checks may be performed to account for possible inversions that may have caused the control circuit to construe the edge of the preamble symbol incorrectly. Note also that if the first preamble symbol 304 was matched at the receiver, the next several checks that are made would be checking the subsequent unscrambled preamble symbols 304(2)-304(N).

After alignment, data may be sent (block 410) as part of the transport portion 208. If errors are detected, such as a string of cyclic redundancy check (CRC) errors, incorrect sequence numbers, or the like (bock 412), the control circuit of the receiver may enter a recovery phase, using a process similar to the fine alignment (block 414).

Figure 5:
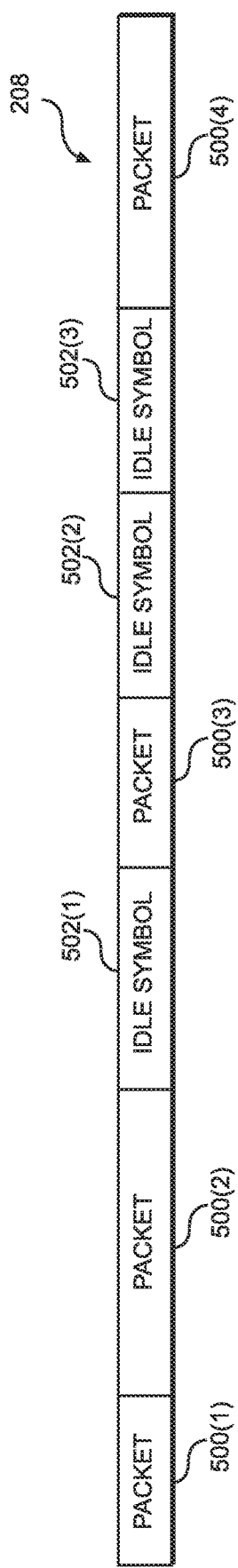
FIG. 5 is a signal diagram illustrating an alternate active portion of the short duty-cycle signal of FIG. 2, wherein the signal includes information bearing packets as well as IDLE symbols.

The recovery is premised on the general nature of the link in that the link is likely never used at 100% capacity. There will always be some IDLE symbols inserted into the data or transport portion 208. An example of the transport portion 208 is provided in FIG. 5, where packets 500(1)-500(4) have IDLE symbols 502(1)-502(3) interspersed therebetween.

Returning to FIG. 4 and the recovery of block 414, the control circuit of the receiver attempts to realign and resync the scrambler. However, there is no hint of a starting position from the coarse alignment, so comparisons must be made at every bit to see if they can find a match for an IDLE symbol. Further, data may be inverted so testing for inverted solutions may also be performed. Also, unlike the normal fine alignment, a hard decision may be required to minimize the chances of a false lock. Because recovery is a low probability event, latency is less critical than the initial alignment.

The recovery of block 414 gives the frame alignment and the scrambler seed (block 416) so that data transmission may resume (block 410). After data transmission concludes, the link may return to sleep (block 418).

Exemplary aspects of the present disclosure may be applicable to any high-speed communication link that uses scrambling and particularly, scrambling that uses a unique or specific scrambler seed per lane, including, but not limited to, PCIE, MIPI's DigRF, and USB, and is particularly well suited for use with a communication link having a serial communication port that is shared between a plurality of channels such as QLINK. While QLINK is particularly contemplated, the disclosure is not limited to QLINK.

While the self-aligning properties of the present disclosure have merit on their own, the present disclosure provides additional benefits. Specifically, the present disclosure allows for flexible lane ordering and/or attachment while still accommodating swapped or inverted lanes. Further, the automatic detection replaces any requirement for a priori knowledge of lane mapping or seeds to make for a much simpler initialization sequence.

The differences between alternative lane mapping and the present disclosure are presented by comparing the processes 600 of FIG. 6A and 650 of FIG. 6B. Specifically, process 600 represents an alternative lane mapping process. The process 600 begins at block 602. The host or master aligns uplink and downlink on a lane zero using a known scrambler seed and lane polarity (block 604), which may be hard coded, fused, or require a side channel. The host or master then uploads microcode with lane mapping from the host to a device (block 606). The link configures correct scrambler seeds per mapping on both sides of the link (block 608), and all link lanes are aligned (block 610). The link may then be active (block 612).

In contrast, with the present disclosure, the process 650 is relatively simple with the process starting (block 652). Each receiver performs the automatic seed detection and alignment to align all lanes with automatic seed and polarity detection (block 654) and the link is active (block 656).

Figure 7B:
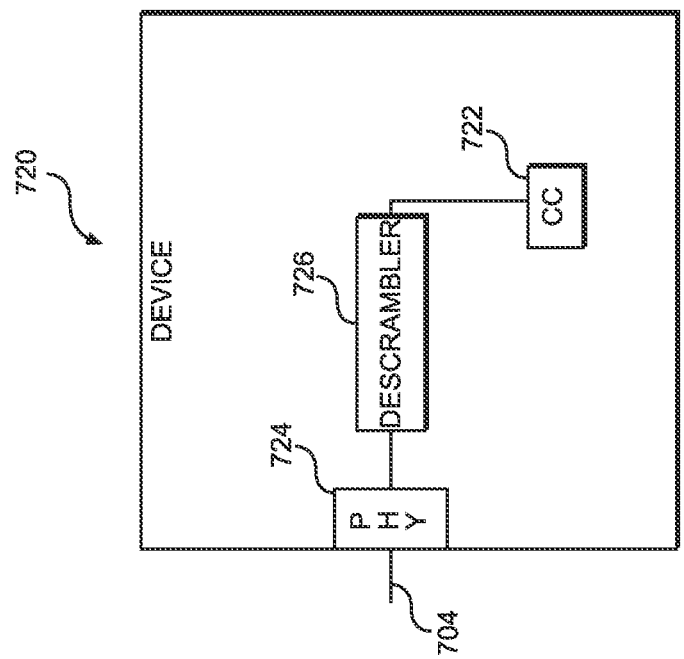
FIG. 7B is a block diagram of exemplary hardware for a slave or device that detects incoming signals and derives a seed and self-aligns based on the detection.
Figure 7A:
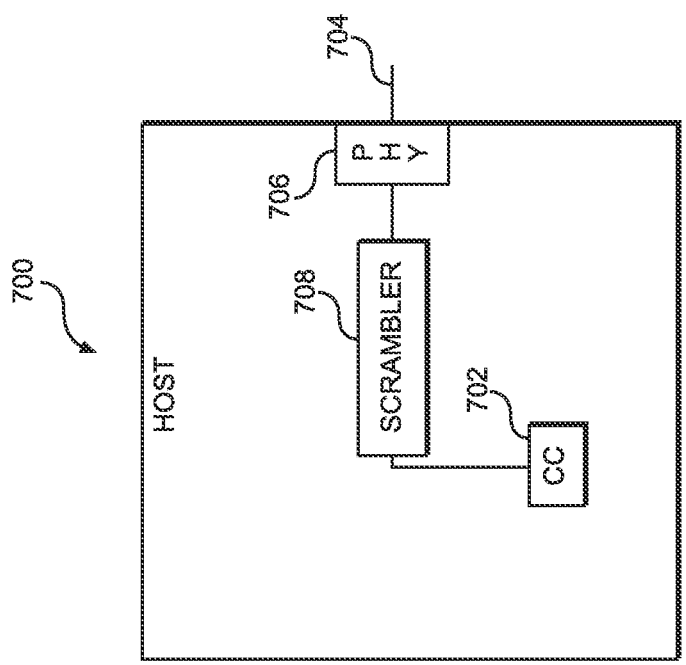
FIG. 7A is a block diagram of exemplary hardware for a master or host that sends signals from which self-alignment may be performed.
Figure 7C:
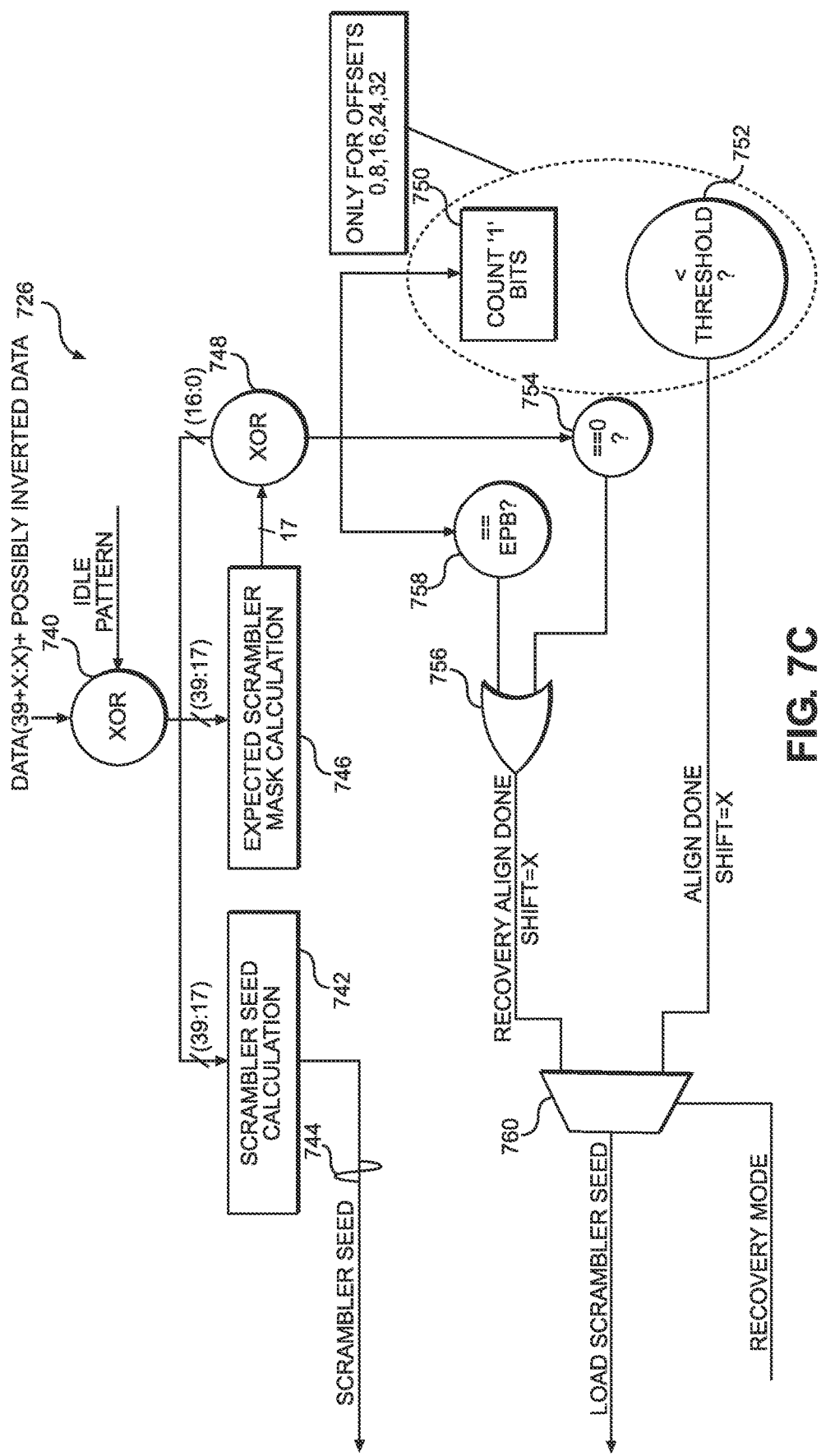
FIG. 7C is a block diagram for an exemplary circuit that may be used to detect alignment at a specific offset according to an exemplary aspect of the present disclosure.

While the processes of the present disclosure may be implemented in various hardware elements depending on the nature of the link, exemplary hardware for a master or host is provided in FIG. 7A, exemplary hardware for a slave or device is provided in FIG. 7B, and an exemplary block diagram of a circuit for alignment detection is provided in FIG. 7C.

In this regard, FIG. 7A illustrates a master or host integrated circuit (IC) 700 that includes a control circuit 702 configured to assemble signals on a communication link 704. For example, the control circuit 702 may reference a register or the like to add the preamble portion to a signal to be sent. Likewise, the IDLE symbol may be stored in memory associated with the control circuit and sent as part of the signal. The host IC 700 couples to the communication link 704 at a physical layer (PHY) 706 that may be an input and/or output for the host IC 700. A scrambler circuit 708 may be distinct from the control circuit 702 or integrated into the control circuit 702. Alternatively, the scrambler circuit 708 may be in the PHY 706.

Similarly, FIG. 7B illustrates a slave or device IC 720 that includes a control circuit 722 configured to perform aspects of the present disclosure. The device IC 720 may be coupled to the communication link 704 by a PHY 724. A descrambler/alignment circuit 726 may be used with the control circuit 722 to perform the process 400. Note that the descrambler circuitry may be separate from and/or distinct from the alignment circuitry. Accordingly, there may be a separate alignment circuit.

FIG. 7C illustrates the descrambler/alignment circuit 726. The descrambler/alignment circuit 726 has an XOR circuit 740 that receives forty bits from the PHY 724 and an unscrambled IDLE symbol (or other known repeated pattern such as an EPB symbol). The results are sent to a scrambler seed calculation circuit 742 that calculates the scrambler seed 744. The results are also sent to an expected scrambler mask calculation circuit 746 which provides an expected set of values for the last seventeen bits of the incoming signal. These seventeen bits are subjected to an XOR operation by an XOR circuit 748 with the last seventeen bits of the incoming signal. The results of the XOR circuit 748 are counted by a bit counter 750 to see if they exceed a threshold in a threshold test circuit 752. If the number of 1 bits is below the threshold, a soft decision may be made that the alignment is correct. Note that this soft decision is only done for the fine adjustment after coarse adjustment and thus only at the expected offsets. Likewise, if the output of the XOR circuit 748 is zero (0), then a circuit 754 is activated to provide an input to an OR circuit 756. The results of the XOR circuit 748 may also be compared to an EPB) symbol in a circuit 758, which is also provided to the OR circuit 756. The reason to compare to the EPB symbol is that EPB symbols are sent repeatedly instead of IDLE symbols when the link is about to go to sleep. If the circuit 726 had only compared to IDLE symbols and the link entered a recovery state right before going to sleep, the circuit may never recover because there would no IDLE symbols on the bus. Comparing to both IDLE symbols and EPB symbols allows recovery. The output of the OR circuit 756 and the threshold test circuit 752 are multiplexed at a multiplexer 760, which selects the scrambler seed when indicated.

Note that it is assumed that there is a shift-register (not shown) that holds a history of seventy-nine (79) bits received, shifted by forty bits per cycle. The logic of FIG. 7C is replicated for each one of the 40 possible bit positions, but a threshold-based decision is only needed for offsets of the multiples of eight bits indicated by the coarse alignment.

The high-speed communication links with self-aligned scrambling according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are described in the following numbered clauses:

1. A device comprising:
    a physical layer (PHY) configured to be coupled to a communication link and receive signals therefrom;
    an alignment circuit coupled to the PHY; and
    a control circuit configured to:
        cause the alignment circuit to detect a possible edge of an unscrambled preamble symbol in an alignment portion of a received signal;
        based on a position of the possible edge, check a scrambled known symbol for a scrambler seed and alignment; and
        align based on checking the scrambled known symbol.
2. The device of clause 1, wherein the device comprises a transceiver integrated circuit (IC).
3. The device of clause 1 or 2, wherein the PHY comprises a universal serial bus (USB) PHY.
4. The device of clause 1 or 2, wherein the PHY comprises a peripheral component interconnect express (PCIE) PHY.
5. The device of clause 1 or 2, wherein the PHY comprises a DIGRF PHY.
6. The device of clause 1 or 2, wherein the PHY comprises a QLINK PHY.
7. The device of clause 1 or 2, wherein the PHY comprises a high-speed serial PHY.
8. The device of any previous clause, wherein the alignment circuit comprises an exclusive OR (XOR) circuit configured to perform an XOR operation on a portion of the received signal at the possible edge with an unscrambled version of the scrambled known symbol.
9. The device of clause 8, wherein the alignment circuit is configured to determine a possible scrambler seed based on the XOR operation on the portion of the received signal at the possible edge with the unscrambled version of the scrambled known symbol.
10. The device of clause 9, wherein the alignment circuit is configured to test the possible scrambler seed using a second portion of the received signal.
11. The device of any previous clause wherein the control circuit is further configured to receive the received signal through the PHY and the receive signal comprises the alignment portion, a transport portion, and an enter sleep portion.
12. The device of any previous clause, wherein the received signal comprises an alignment portion and the alignment portion comprises:
    a preamble portion containing the unscrambled preamble symbol; and
    a scrambled portion containing the scrambled known symbol.
13. The device of any previous clause, wherein the preamble portion containing the unscrambled preamble symbol contains a plurality of unscrambled preamble symbols.
14. The device of any previous clause, wherein the scrambled portion containing the scrambled known symbol contains a plurality of scrambled known symbols.
15. The device of any previous clause, wherein the control circuit is configured to be in a sleep mode prior to receipt of the received signal.
16. A host comprising:
    a physical layer (PHY) configured to be coupled to a communication link and send signals thereon;
    a scrambler circuit; and
    a control circuit configured to:
        assemble a signal using a plurality of unscrambled preamble symbols followed by a second plurality of scrambled known symbols using the scrambler circuit; and
        send the signal to a device over the communication link through the PHY.
17. The host of clause 16, wherein the host comprises a modem.
18. The host of clause 16 or 17, wherein the PHY comprises a high-speed serial PHY.
19. The host of any of clauses 16 to 18, wherein the scrambler circuit has a width of twenty-three (23) bits.
20. The host of any of clauses 16 to 19, wherein a preamble symbol in the plurality of unscrambled preamble symbols is sixteen (16) bits.
21. The host of any of clauses 16 to 20, wherein a preamble symbol in the plurality of unscrambled preamble symbols is 1111_1111_0000_0000.
22. The host of any of clauses 16 to 21, wherein a known symbol in the second plurality of scrambled known symbols is forty (40) bits.
23. A computing device comprising:
    a serial communication link;
    a host comprising:
        a host physical layer (PHY) coupled to the serial communication link and configured to send signals thereon;
        a scrambler circuit; and
        a control circuit configured to:
            assemble a signal using a plurality of unscrambled preamble symbols followed by a second plurality of scrambled known symbols using the scrambler circuit; and
            send the signal to a device over the serial communication link through the host PHY; and
    a device comprising:
        a device PHY coupled to the serial communication link and configured to receive the signal therefrom;
        an alignment circuit coupled to the device PHY; and
        a control circuit configured to:
            cause the alignment circuit to detect a possible edge of an unscrambled preamble symbol of the plurality of unscrambled preamble symbols;
            based on a position of the possible edge, check a scrambled known symbol of the second plurality of scrambled known symbols for a scrambler seed and alignment; and
            align based on checking the scrambled known symbol.
24. The computing device of clause 20, wherein the serial communication link comprises a QLINK bus.
25. A method for aligning a device coupled to a communication link, the method comprising:

receiving a plurality of unscrambled preamble symbols;
detecting an edge of one of the plurality of unscrambled preamble symbols;
based on the edge, testing a scrambled known symbol against an unscrambled version of the scrambled known symbol to derive a scrambler seed; and
testing a portion of the scrambled known symbol using the scrambler seed.

26. The method of clause 25, further comprising receiving a plurality of scrambled known symbols after receiving the plurality of unscrambled preamble symbols.

27. The method of clause 26, further comprising receiving a transport portion of a signal after receiving the plurality of scrambled known symbols.

28. The method of any of clauses 25 to 27, further comprising waking from a sleep mode before receiving the plurality of unscrambled preamble symbols.

29. The method of any of clauses 25 to 28, wherein receiving the plurality of unscrambled preamble symbols comprises receiving a symbol having sixteen (16) bits.

30. The method of any of clauses 25 to 29, wherein receiving the symbol having 16 bits comprises receiving a symbol comprising 1111_1111_0000_0000.

What is claimed is:

1. A device comprising:
   a physical layer (PHY) configured to be coupled to a communication link and receive signals therefrom;
   an alignment circuit coupled to the PHY, the alignment circuit comprising an exclusive OR (XOR) circuit; and
   a control circuit configured to:
      cause the alignment circuit to detect a possible edge of an unscrambled preamble symbol in an alignment portion of a received signal;
      based on a position of the possible edge, check a scrambled known symbol for a scrambler seed and alignment; and
      align based on checking the scrambled known symbol;
   wherein the XOR circuit is configured to perform an XOR operation on a portion of the received signal at the possible edge with an unscrambled version of the scrambled known symbol.

2. The device of claim 1, wherein the device comprises a transceiver integrated circuit (IC).

3. The device of claim 1, wherein the PHY comprises a universal serial bus (USB) PHY.

4. The device of claim 1, wherein the PHY comprises a peripheral component interconnect express (PCIE) PHY.

5. The device of claim 1, wherein the PHY comprises a DIGRF PHY.

6. The device of claim 1, wherein the PHY comprises a QLINK PHY.

7. The device of claim 1, wherein the PHY comprises a high-speed serial PHY.

8. The device of claim 1, wherein the alignment circuit is configured to determine a possible scrambler seed based on the XOR operation on the portion of the received signal at the possible edge with the unscrambled version of the scrambled known symbol.

9. The device of claim 8, wherein the alignment circuit is configured to test the possible scrambler seed using a second portion of the received signal.

10. The device of claim 1, wherein the control circuit is further configured to receive the received signal through the PHY and the received signal comprises the alignment portion, a transport portion, and an enter sleep portion.

11. The device of claim 1, wherein the received signal comprises the alignment portion and the alignment portion comprises:
   a preamble portion containing the unscrambled preamble symbol; and
   a scrambled portion containing the scrambled known symbol.

12. The device of claim 11, wherein the preamble portion containing the unscrambled preamble symbol contains a plurality of unscrambled preamble symbols.

13. The device of claim 11, wherein the scrambled portion containing the scrambled known symbol contains a plurality of scrambled known symbols.

14. The device of claim 11, wherein the control circuit is configured to be in a sleep mode prior to receipt of the received signal.

15. A host comprising:
   a physical layer (PHY) configured to be coupled to a communication link and send signals thereon;
   a scrambler circuit; and
   a control circuit configured to:
      assemble a signal using a plurality of unscrambled preamble symbols followed by a second plurality of scrambled known symbols using the scrambler circuit, wherein a preamble symbol in the plurality of unscrambled preamble symbols is sixteen (16) bits; and
      send the signal to a device over the communication link through the PHY.

16. The host of claim 15, wherein the host comprises a modem.

17. The host of claim 15, wherein the PHY comprises a high-speed serial PHY.

18. The host of claim 15, wherein the scrambler circuit has a width of twenty-three (23) bits.

19. The host of claim 15, wherein a preamble symbol in the plurality of unscrambled preamble symbols is 1111_1111_0000_0000.

20. The host of claim 15, wherein a known symbol in the second plurality of scrambled known symbols is forty (40) bits.

21. A computing device comprising:
   a serial communication link;
   a host comprising:
      a host physical layer (PHY) coupled to the serial communication link and configured to send signals thereon;
      a scrambler circuit; and
      a control circuit configured to:
         assemble a signal using a plurality of unscrambled preamble symbols followed by a second plurality of scrambled known symbols using the scrambler circuit; and
         send the signal to a device over the serial communication link through the host PHY; and
   a device comprising:
      a device PHY coupled to the serial communication link and configured to receive the signal therefrom;
      an alignment circuit coupled to the device PHY, the alignment circuit comprising an exclusive OR (XOR) circuit; and
      a control circuit configured to:
         cause the alignment circuit to detect a possible edge of an unscrambled preamble symbol in an alignment portion of a received signal;

based on a position of the possible edge, check a scrambled known symbol for a scrambler seed and alignment; and align based on checking the scrambled known symbol;

wherein the XOR circuit is configured to perform an XOR operation on a portion of the received signal at the possible edge with an unscrambled version of the scrambled known symbol.

22. The computing device of claim 21, wherein the serial communication link comprises a QLINK bus.

23. A method for aligning a device coupled to a communication link, the method comprising:

receiving a plurality of unscrambled preamble symbols;

detecting an edge of one of the plurality of unscrambled preamble symbols;

based on the edge, testing, using an alignment circuit comprising an exclusive OR (XOR) circuit, a scrambled known symbol against an unscrambled version of the scrambled known symbol to derive a scrambler seed; and testing a portion of the scrambled known symbol using the scrambler seed.

24. The method of claim 23, further comprising receiving a plurality of scrambled known symbols after receiving the plurality of unscrambled preamble symbols.

25. The method of claim 24, further comprising receiving a transport portion of a signal after receiving the plurality of scrambled known symbols.

26. The method of claim 23, further comprising waking from a sleep mode before receiving the plurality of unscrambled preamble symbols.

27. The method of claim 23, wherein receiving the plurality of unscrambled preamble symbols comprises receiving a symbol having sixteen (16) bits.

28. The method of claim 27, wherein receiving the symbol having 16 bits comprises receiving a symbol comprising 1111_1111_0000_0000.

* * * * *